(12) United States Patent
Swanson et al.

(10) Patent No.: US 9,774,294 B2
(45) Date of Patent: Sep. 26, 2017

(54) PREVENTING HARMFUL POLARIZATION OF SOLAR CELLS

(71) Applicant: SunPower Corporation, San Jose, CA (US)

(72) Inventors: Richard M. Swanson, Los Altos Hills, CA (US); Denis De Ceuster, Woodside, CA (US); Vikas Desai, Cupertino, CA (US); Douglas H. Rose, San Jose, CA (US); David D. Smith, Campbell, CA (US); Neil Kaminar, Santa Cruz, CA (US)

(73) Assignee: SunPower Corporation, San Jose, CA (US)

( * ) Notice: Subject to any disclaimer, the term of this patent is extended or adjusted under 35 U.S.C. 154(b) by 0 days.

(21) Appl. No.: 15/240,913

(22) Filed: Aug. 18, 2016

(65) Prior Publication Data

US 2017/0047888 A1 Feb. 16, 2017

Related U.S. Application Data

(60) Continuation of application No. 14/687,624, filed on Apr. 15, 2015, now abandoned, which is a division of
(Continued)

(51) Int. Cl.
| | |
|---|---|
| H01L 31/042 | (2014.01) |
| H02S 40/32 | (2014.01) |
| H01L 31/0216 | (2014.01) |
| H01L 31/0224 | (2006.01) |
| H01L 31/048 | (2014.01) |
| H01L 31/05 | (2014.01) |
| H01L 31/18 | (2006.01) |

(Continued)

(52) U.S. Cl.
CPC ........ *H02S 40/32* (2014.12); *H01L 31/02167* (2013.01); *H01L 31/02168* (2013.01); *H01L 31/022466* (2013.01); *H01L 31/048* (2013.01); *H01L 31/049* (2014.12); *H01L 31/0504* (2013.01); *H01L 31/0516* (2013.01); *H01L 31/18* (2013.01); *H02J 3/383* (2013.01); *H02J 3/46* (2013.01); *H02S 30/10* (2014.12); *H02S 40/36* (2014.12); *Y02B 10/12* (2013.01); *Y02B 10/14* (2013.01); *Y02E 10/52* (2013.01); *Y02E 10/547* (2013.01); *Y10T 29/49117* (2015.01)

(58) Field of Classification Search
CPC ............... H02S 40/32; H01L 31/02167; H01L 31/02168; H01L 31/022466; H01L 31/048
USPC ........................................................ 136/244
See application file for complete search history.

(56) References Cited

U.S. PATENT DOCUMENTS

| | | | |
|---|---|---|---|
| 4,838,952 A * | 6/1989 | Dill ................... | H01L 31/03529 136/256 |
| 2003/0070368 A1* | 4/2003 | Shingleton ............ | F24J 2/5205 52/173.3 |
| 2003/0075211 A1* | 4/2003 | Makita ................... | F24J 2/5237 136/244 |

* cited by examiner

*Primary Examiner* — Jayne Mershon
(74) *Attorney, Agent, or Firm* — Okamoto & Benedicto LLP

(57) ABSTRACT

In one embodiment, harmful solar cell polarization is prevented or minimized by providing a conductive path that bleeds charge from a front side of a solar cell to the bulk of a wafer. The conductive path may include patterned holes in a dielectric passivation layer, a conductive anti-reflective coating, or layers of conductive material formed on the top or bottom surface of an anti-reflective coating, for example. Harmful solar cell polarization may also be prevented by biasing a region of a solar cell module on the front side of the solar cell.

17 Claims, 10 Drawing Sheets

Related U.S. Application Data application No. 12/845,627, filed on Jul. 28, 2010, now Pat. No. 9,035,167, which is a continuation of application No. 12/477,796, filed on Jun. 3, 2009, now Pat. No. 7,786,375, which is a continuation of application No. 11/210,213, filed on Aug. 22, 2005, now Pat. No. 7,554,031.

(60) Provisional application No. 60/658,706, filed on Mar. 3, 2005.

(51) Int. Cl.
*H01L 31/049* (2014.01)
*H02S 30/10* (2014.01)
*H02S 40/36* (2014.01)
*H02J 3/38* (2006.01)
*H02J 3/46* (2006.01)

PREVENTING HARMFUL POLARIZATION OF SOLAR CELLS

CROSS-REFERENCE TO RELATED APPLICATIONS

This application is a continuation of U.S. application Ser. No. 14/687,624, filed on Apr. 15, 2015, which is a division of U.S. application Ser. No. 12/845,627, filed on Jul. 28, 2010, now U.S. Pat. No. 9,035,167, which is a continuation of U.S. application Ser. No. 12/477,796, filed on Jun. 3, 2009, now U.S. Pat. No. 7,786,375, which is a continuation of U.S. application Ser. No. 11/210,213, filed on Aug. 22, 2005, now U.S. Pat. No. 7,554,031, which claims the benefit of U.S. Provisional Application No. 60/658,706, filed Mar. 3, 2005, all of which are incorporated herein by reference in their entirety.

BACKGROUND OF THE INVENTION

1. Field of the Invention

The present invention relates generally to solar cells, and more particularly but not exclusively to solar cell structures, modules, fabrication, and field installation.

2. Description of the Background Art

Solar cells are well known devices for converting solar radiation to electrical energy. They may be fabricated on a semiconductor wafer using semiconductor processing technology. Generally speaking, a solar cell may be fabricated by forming p-type regions and n-type regions in a silicon substrate. Each adjacent p-type region and n-type region forms a p-n junction. Solar radiation impinging on the solar cell creates electrons and holes that migrate to the p-type and n-type regions, thereby creating voltage differentials across the p-n junctions. In a backside contact solar cell, the p-type and n-type regions are coupled to metal contacts on the backside of the solar cell to allow an external electrical circuit or device to be coupled to and be powered by the solar cell. Backside contact solar cells are also disclosed in U.S. Pat. Nos. 5,053,083 and 4,927,770, which are both incorporated herein by reference in their entirety.

Several solar cells may be connected together to form a solar cell array. The solar cell array may be packaged into a solar cell module, which includes protection layers to allow the solar cell array to withstand environmental conditions and be used in the field. If precautions are not taken, solar cells may become highly polarized in the field, causing reduced output power. Techniques for preventing harmful polarization of solar cells are disclosed herein.

SUMMARY

In one embodiment, harmful solar cell polarization is prevented or minimized by providing a conductive path that bleeds charge from a front side of a solar cell to the bulk of a wafer. The conductive path may include patterned holes in a dielectric passivation layer, a conductive anti-reflective coating, or layers of conductive material formed on the top or bottom surface of an anti-reflective coating, for example. Harmful solar cell polarization may also be prevented by biasing a region of a solar cell module on the front side of the solar cell.

These and other features of the present invention will be readily apparent to persons of ordinary skill in the art upon reading the entirety of this disclosure, which includes the accompanying drawings and claims.

The use of the same reference label in different drawings indicates the same or like components. Drawings are not necessarily to scale unless otherwise noted.

DETAILED DESCRIPTION

In the present disclosure, numerous specific details are provided, such as examples of apparatus, components, and methods, to provide a thorough understanding of embodiments of the invention. Persons of ordinary skill in the art will recognize, however, that the invention can be practiced without one or more of the specific details. In other instances, well-known details are not shown or described to avoid obscuring aspects of the invention.

Figure 1:
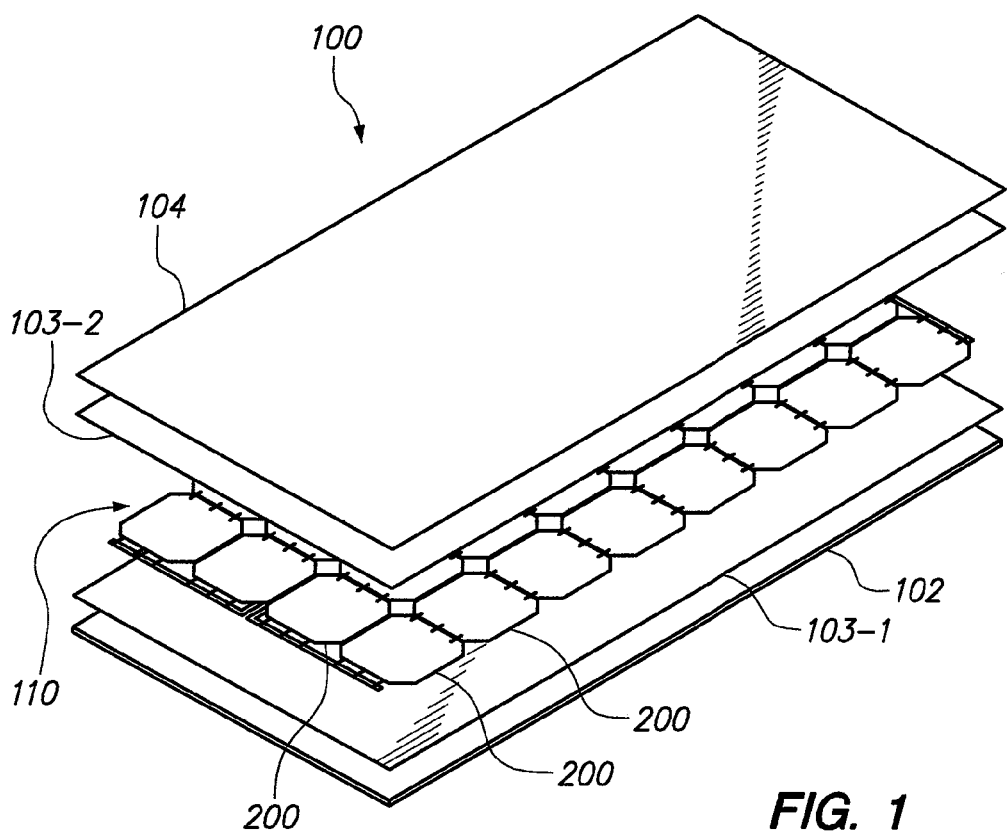
FIG. 1 shows an exploded view of an example solar cell module that may take advantage of embodiments of the present invention.

Referring now to FIG. 1, there is shown an exploded view of an example solar cell module 100 that may take advantage of embodiments of the present invention. Such a solar cell module is also disclosed in commonly-assigned U.S. application Ser. No. 10/633,188, filed on Aug. 1, 2003. It is to be noted, however, that embodiments of the present invention are also applicable to other solar cell modules.

In the example of FIG. 1, the solar cell module 100 includes a transparent cover 104, encapsulants 103 (i.e., 103-1, 103-2), a solar cell array 110 comprising interconnected solar cells 200, and a back sheet 102. The solar cell module 100 is a so-called "terrestrial solar cell module" in that it is typically used in stationary applications, such as on rooftops or by power generating stations. As such, the solar cell module 100 is installed with the transparent cover 104 facing the sun. In one embodiment, the transparent cover 104 comprises glass. The front sides of the solar cells 200 face towards the sun by way of the transparent cover 104. Encapsulants 103 crosslink and bond the solar cells 200, the cover 104, and the back sheet 102 to form a protective package. In one embodiment, the encapsulants 103 comprise poly-ethyl-vinyl acetate ("EVA").

The backsides of the solar cells 200 face the back sheet 102, which is attached to the encapsulant 103-1. In one embodiment, the back sheet 102 comprises Tedlar/Polyester/EVA ("TPE") from the Madico company. In the TPE, the Tedlar is the outermost layer that protects against the environment, the polyester provides additional electrical isolation, and the EVA is a non-crosslinked thin layer that promotes adhesion to the encapsulant 103-1. Alternatives to TPE for use as the back sheet 102 include Tedlar/Polyester/Tedlar ("TPT"), for example.

Figure 2:
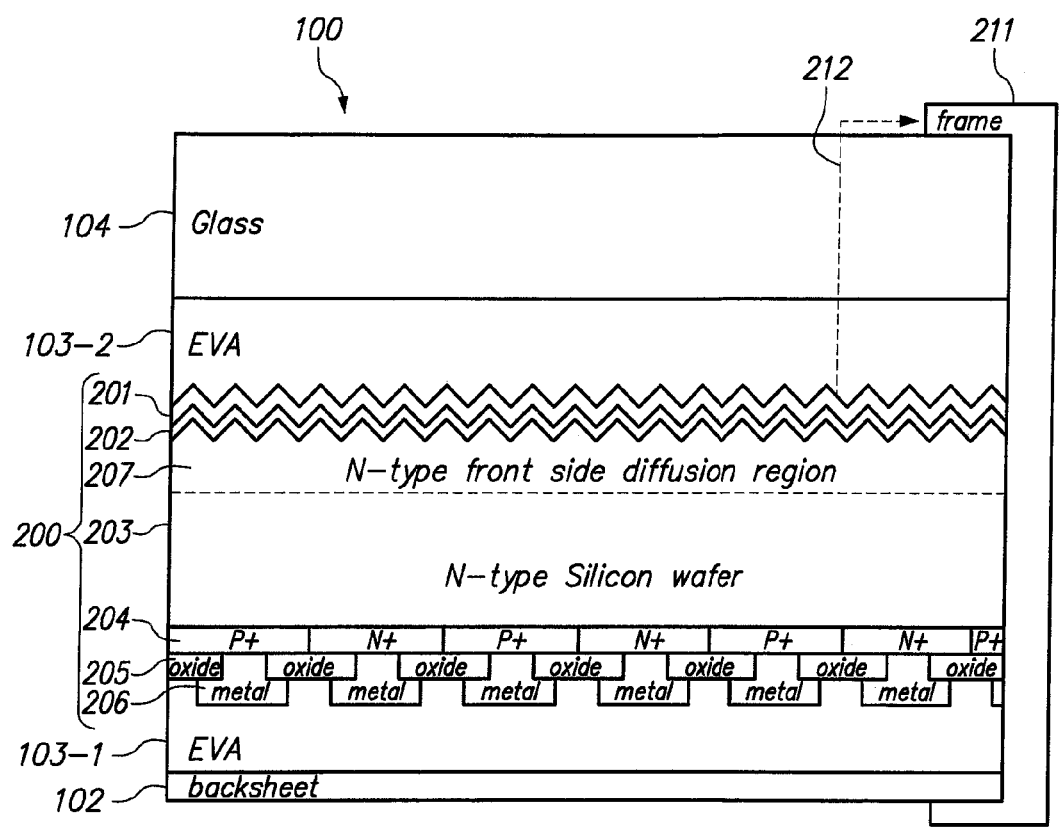
FIG. 2 schematically shows a cross-section of the solar cell module of FIG. 1.

FIG. 2 schematically shows a cross-section of the solar cell module 100. FIG. 2 has been annotated with example materials for ease of understanding. However, it is to be noted that other materials may also be employed without detracting from the merits of the present invention. For purposes of the present disclosure, the front side of the solar cell comprises materials, components, and features on the front side of the wafer 203 (i.e. from the passivation layer 202 towards the cover 104), while the backside of the solar cell comprises those on the backside of the wafer 203 (i.e. from the doped regions 204 towards the back sheet 102). The materials on the front side of the solar cell 200 are configured to face the sun during normal operation. The materials on the front side of the solar cell 200 are transparent by nature or thickness to allow solar radiation to shine through.

In the example of FIG. 2, a wafer 203 comprises an n-type silicon wafer with an n-type front side diffusion region 207. Front side diffusion region 207 has been schematically separated with a dash line to indicate that it is in the silicon of wafer 203. A dielectric passivation layer 202, which comprises silicon dioxide in the example of FIG. 2, is formed on the front side of the wafer 203. An anti-reflective coating ("ARC") 201 is formed on top of the dielectric passivation layer 202. In one embodiment, the anti-reflective coating 201 comprises silicon nitride formed to a thickness of about 400 Angstroms by plasma enhanced chemical vapor deposition (PECVD). In one embodiment, the passivation layer 202 comprises silicon dioxide formed to a thickness of about 200 Angstroms. The passivation layer 202 may be grown directly on the top surface of the wafer 203 by high temperature oxidation.

In the example of FIG. 2, p-type doped ("P+") and n-type doped ("N+") regions 204 serving as charge collection junctions of the solar cell 200 are formed in the wafer 203. The p-type and n-type doped regions 204 may also be formed external to the wafer 203, such as in a layer formed on the backside of the wafer 203, without detracting from the merits of the present invention. Metal contacts 206 are formed on the backside of the solar cell 200, with each metal contact 206 being coupled to a corresponding p-type doped or n-type doped collection region. An oxide layer 205 is patterned to allow metal contacts 206 to be connected to the doped regions 204. Typically, metal contacts 206 are connected to metal contacts of other solar cells 200 in the solar cell array 110. Metal contacts 206 allow an external circuit or device to receive electrical current from the solar cell module 100. The solar cell 200 is a backside contact solar cell in that all electrical connections to its collection regions are formed on its backside.

As shown in FIG. 2, the solar cell 200 is protected by back sheet 102, encapsulants 103, and cover 104. A frame 211 surrounds the solar cell 200 and its protection layers. Under certain conditions, the output power generation capability of the solar cell module 100 may be substantially reduced. This reduction in output power is reversible in that the solar cell module 100 may be restored back to its original condition by, for example, biasing the solar cell module 100 with high voltage in a beneficial current flow direction. The inventors believe that this output power reduction is due to the solar cell 200 becoming polarized when charge leaks from the front side of the solar cell 200 to the frame 211 as indicated by arrow 212. In one example, positive charge carriers leak from the front side of the solar cell 200, thereby leaving the surface of the anti-reflective coating 201 negatively charged. The negative charge on the surface of the anti-reflective coating 201 attracts positively charged light generated holes, some of which recombine with electrons in the n-type silicon wafer 203 instead of being collected at a doped collection region.

Because the solar cell 200 has an n-type front side diffusion region, harmful polarization may occur when, in the field, the dielectric passivation layer 202 has an electric field polarity such that electrons are repelled, and holes attracted, to the interface between the dielectric passivation layer 202 and front side diffusion region 207, i.e., when the potential of the dielectric passivation layer 202 is less than the front side diffusion region 207. In field operation, this would occur when the solar cell 200 is operated at a positive voltage with respect to ground. In other embodiments where a solar cell has a p-type front side diffusion region, harmful solar cell polarization may occur when the solar cell becomes negatively biased (i.e. becomes more negative) relative to ground in the field. As is well-known, a p-type silicon wafer may be doped to have an n-type front side diffusion region. Similarly, an n-type silicon wafer may be doped to have a p-type front side diffusion region. Although the example solar cell 200 has an n-type front side diffusion region in an n-type silicon wafer, the teachings of the present invention may be adapted to other types of solar cell substrates.

Figure 3A:
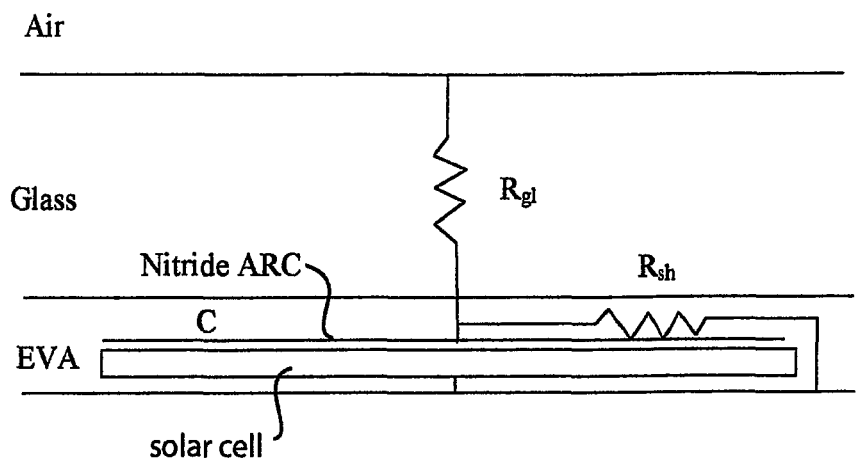
FIGS. 3A and 3B show models for the mechanism the inventors believe causes solar cell polarization.
Figure 3B:
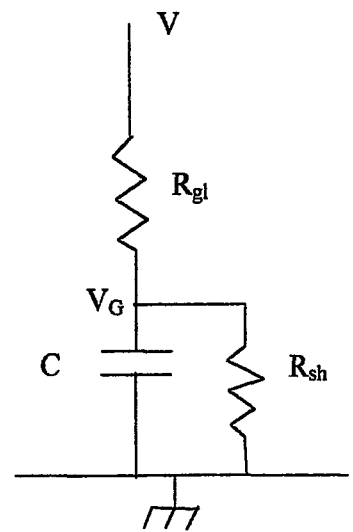

FIG. 3A schematically shows a model for the mechanism that the inventors believe is responsible for solar cell polarization. In the model of FIG. 3A, current flows to or from the solar cell through the front of the glass (e.g. cover 104) and is leaked off by a shunt to the back surface of the solar cell. Resistance $R_{gl}$ represents the leakage resistance from the nitride ARC (e.g. anti-reflective coating 201) to the glass front and $R_{sh}$ is the shunt leakage from the nitride ARC to the back of the solar cell. In reality, there will be a distributed voltage developed across the solar cell which starts at a low value at the edge and builds up toward the middle. In any case, the nitride ARC to silicon wafer voltage shouldn't exceed the oxide breakdown voltage. In FIGS. 3A and 3B, the capacitance "C" represents a capacitor comprising an oxide passivation layer (e.g. dielectric passivation layer 202) serving as a dielectric, the nitride ARC serving as a first capacitor plate, and the silicon wafer serving as a second capacitor plate.

FIG. 3B schematically shows the lumped element approximation equivalent circuit for the structure of FIG. 3A. For purposes of this analysis, the voltages are referenced to the back of the solar cell. The transient solution to this circuit, assuming that the starting gate voltage is zero is shown by equation EQ. 1.

$$V_G(t) = V \frac{R_{sh}}{R_{sh} + R_{gl}} \left(1 - e^{-t/\tau}\right) \quad \text{EQ. 1}$$

Where $$\tau = \frac{CR_{sh}R_{gl}}{R_{sh} + R_{gl}} = CR_{eq}$$

and $R_{eq}$ is the parallel equivalent resistance. $V_G$ represents the voltage on the front EVA encapsulant, which behaves like a gate of a metal oxide semiconductor (MOS) transistor. The gate oxide of the MOS transistor is the oxide dielectric passivation layer. As mentioned, the capacitance "C" represents the capacitor formed by the nitride ARC, the oxide passivation layer, and the silicon wafer.

Upon power up of the solar cell, the gate (i.e. front side EVA encapsulant) will ramp upward and reach a voltage $V_T$ which causes a certain degradation amount after a degradation time $t_{deg}$ represented by the equation EQ. 2.

$$t_{deg} = \tau \ln\left\{\frac{1}{1 - \frac{V}{V_T}\left(1 + \frac{R_{gl}}{R_{sh}}\right)}\right\} \quad \text{EQ. 2}$$

In equation EQ. 2, it is assumed that "V" is positive, but is also true for negative V and negative $V_T$ (threshold voltage of the MOS transistor) if absolute values for voltages are used. For the usual case when $$V\frac{R_{sh}}{R_{gl} + R_{sh}} \gg V_T,$$

equation EQ. 2 reduces to equation EQ. 3.

$$t_{deg} = CR_{gl}\frac{V_T}{V} \quad \text{EQ. 3}$$

From equation EQ. 3, it can be readily seen that for high voltages, the time to a specific amount of degradation is inversely proportional to the applied voltage.

The recovery of the gate voltage for zero applied voltage is given by EQ. 4

$$V_G(t) = V_G(0)e^{-t/\tau} \quad \text{EQ. 4}$$

If $V_T$ is the threshold where negligible degradation occurs, then the recovery time $t_{rec}$ is given by equation EQ. 5.

$$t_{rec} = \tau \ln\left(\frac{V_G(0)}{V_T}\right) \quad \text{EQ. 5}$$

Ultra violet rays will have the effect of adding an additional shunt resistance in parallel with the existing one. This can be seen by assuming that the rate which ultra violet injects electrons from the nitride ARC to the silicon wafer is proportional to the trapped electron density. But the voltage across the capacitor "C" (see FIG. 3B) is proportional to the trapped charge, therefore the current is proportional to the voltage on the gate capacitor; i.e., resistance-like. Assuming that this resistance is small compared to the other shunts (which it must be in order to have an effect) then the recovery time in the light $t_{rec,\,light}$ is given by equation EQ. 6.

$$t_{rec,light} = R_{sh,light} C \ln\left(\frac{V_G(0)}{V_T}\right) \quad \text{EQ. 6}$$

The conditions necessary for the ultra violet induced shunt to be sufficient to keep the solar cell module from degrading may be calculated. This requires the condition given by EQ. 7 to be satisfied.

$$V\frac{R_{sh,light}}{R_{gl}} < V_T \quad \text{EQ. 7}$$

The above equations can be rearranged to show that EQ. 7 is satisfied when the recovery time in the light is given by equation EQ. 8.

$$t_{rec,light} < t_{deg,dark} = CR_{gl}\frac{V_T}{V} \quad \text{EQ. 8}$$

In other words, if the module solar cell module recovers in sunlight, when unbiased, in a shorter time than it takes to degrade in the dark with an applied bias, then the module will be stable in sunlight with that applied bias.

In some embodiments, harmful solar cell polarization is prevented or minimized by increasing vertical electrical conductivity in the front side anti-reflective coating/passivation layer stack. In these embodiments, charge is bled from the front side of the solar cell to the bulk of the wafer. These embodiments are now described with reference to FIGS. 4A and 4B.

Figure 4A:
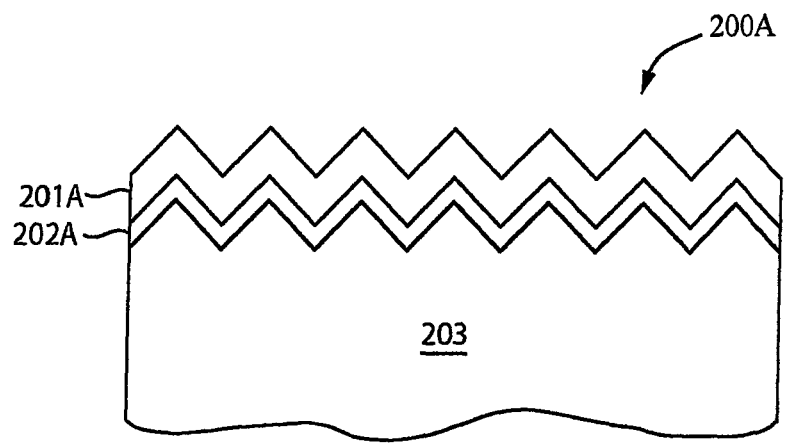
FIGS. 4A, 4B, 5A, 5B, 5C, 5D, and 6 schematically show cross sections of solar cells in accordance with embodiments of the present invention.

FIG. 4A schematically shows a cross section of a solar cell 200A in accordance with an embodiment of the present invention. The solar cell 200A is a specific embodiment of the solar cell 200 shown in FIG. 2. The solar cell 200A is the same as the solar cell 200 except for the use of a very thin oxide (i.e. silicon dioxide) layer 202A as a passivation layer 202 and an anti-reflective coating 201A as an anti-reflective coating 201. In the example of FIG. 4A, the anti-reflective coating 201A may comprise silicon carbide having a thickness of about 400 Angstroms and the wafer 203 comprises an N-type silicon wafer. The thin oxide layer 202A is preferably thin enough to bleed charge to the bulk of the wafer, to prevent charge buildup, and such that oxide breakdown occurs when it develops a relatively high voltage. The thin oxide layer 202A may be formed directly on the wafer 203. In one embodiment, the thin oxide layer 202A is formed to a thickness of about 10 Angstroms to 20 Angstroms using an ozone oxide process, which involves dipping the wafer 203 in a bath comprising ozone suspended in deionized water.

Figure 4B:
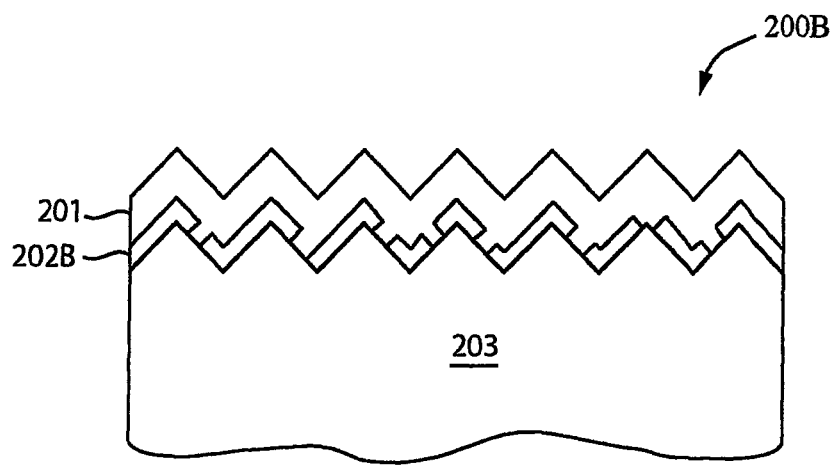

FIG. 4B schematically shows a cross section of a solar cell 200B in accordance with an embodiment of the present invention. The solar cell 200B is a specific embodiment of the solar cell 200 shown in FIG. 2. The solar cell 200B is the same as the solar cell 200 except for the use of a patterned dielectric passivation layer 202B as a passivation level 202. In the example of FIG. 4B, passivation layer 202B comprises silicon dioxide, the anti-reflective coating 201 comprises silicon nitride, and the wafer 203 comprises an N-type silicon wafer. As shown in FIG. 4B, the passivation layer 202B has been patterned to have holes that allow a silicon nitride anti-reflective coating 201 to contact the silicon wafer 203. This allows charge on the anti-reflective coating 201 to bleed to the bulk of the wafer 203 through the patterned holes in the oxide passivation layer 202B. Each hole in passivation layer 202B may be formed using a conventional lithography process, and be as small as the available lithography equipment allows. The patterned holes may be separated by about 0.1 mm to about 2.0 mm from each other, for example. The perforated passivation layer 202B advantageously prevents solar cell polarization by preventing charge build up in the anti-reflective coating 201.

In some embodiments, lateral conduction on the front side and towards the edges of the solar cell is increased to prevent solar cell polarization. Because passivation layers have natural defects (i.e. naturally formed holes) through them, it is possible for a conductive anti-reflective coating to bleed accumulated charge to the bulk of the wafer through the defects. However, some solar cell anti-reflective coatings may not be conductive enough for this to occur. Accordingly, in some embodiments, a conductive layer is formed laterally to contact the anti-reflective coating to allow charge to bleed from the anti-reflective coating to the bulk of the wafer by way of the conductive layer and the natural defects in the passivation layer. In other embodiments, the anti-reflective coating itself is sufficiently conductive. These embodiments are now described with reference to FIGS. 5A-5D.

Figure 5A:
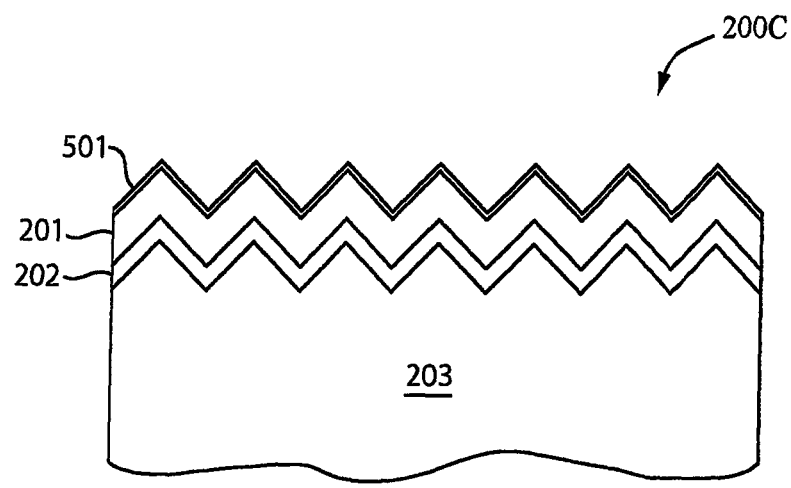

FIG. 5A schematically shows a cross section of a solar cell 200C in accordance with an embodiment of the present invention. The solar cell 200C is a specific embodiment of the solar cell 200 shown in FIG. 2. The solar cell 200C is the same as the solar cell 200 except that a transparent conductive coating 501 is formed on a top surface of the anti-reflective coating 201. In the example of FIG. 5A, the passivation layer 202 comprises silicon dioxide, the anti-reflective coating 201 comprises silicon nitride, and the wafer 203 comprises an N-type silicon wafer. In one embodiment, the transparent conductive coating 501 comprises a conductive organic coating, such as the PEDOT/PSS (Baytron-P) coating. The transparent conductive coating 501 may be sprayed or screen-printed directly on top of the anti-reflective coating 201. The transparent conductive coating 501 may be formed to a thickness of about 100 Angstroms, for example. The transparent conductive coating 501 may be applied on the solar cell 200 as a last step in the solar cell fabrication process, just before encapsulation.

Because the silicon nitride anti-reflective coating 201 is not sufficiently conductive, charge in the silicon nitride can only travel a short distance, which is not enough to reach natural defects in the passivation layer 202. The transparent conductive coating 501 allows charge in the anti-reflective coating 201 to travel a distance sufficient to reach natural defects in the passivation layer 202 and bleed to the bulk of the wafer 203.

Figure 5B:
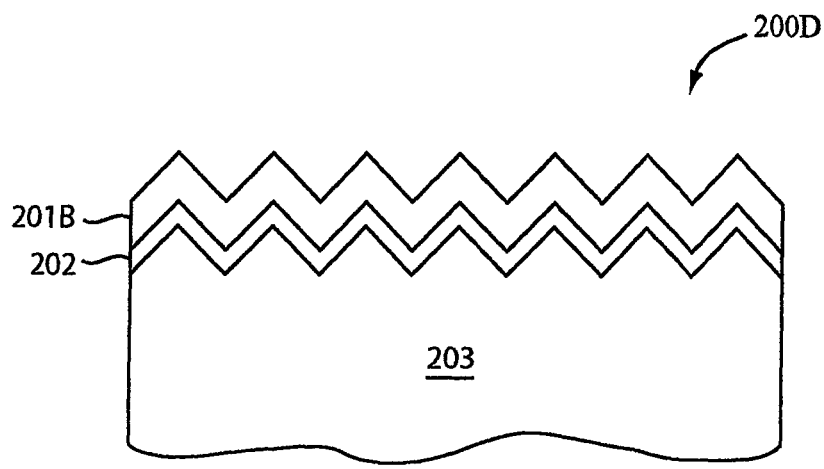

FIG. 5B schematically shows a cross section of a solar cell 200D in accordance with an embodiment of the present invention. The solar cell 200D is a specific embodiment of the solar cell 200 shown in FIG. 2. The solar cell 200D is the same as the solar cell 200 except that a conductive anti-reflective coating (ARC) 201B is used as an anti-reflective coating 201. In the example of FIG. 5B, the passivation layer 202 comprises silicon dioxide and the wafer 203 comprises an N-type silicon wafer. The conductive ARC 201B advantageously minimizes solar cell polarization by preventing charge from accumulating in it. Charge in the conductive ARC 201B may bleed to the bulk of the wafer by way of natural defects in the passivation layer 202.

In one embodiment, the conductive ARC 201B comprises a naturally conductive (i.e. conductive without addition of impurities) anti-reflective coating, such as titanium oxide ($TiO_2$).

In other embodiments, the conductive ARC 201B comprises a non-conductive anti-reflective material that is made conductive by addition of impurities. One way of doing so is by adding metal impurities from a metal gas source during formation of the anti-reflective material on the passivation layer 202. For example, the conductive ARC 201B may comprise tin oxide doped with fluorine (SnO:F), zinc oxide doped with boron (ZnO:B), or silicon carbide doped with phosphorus (SiC:P) or boron (SiC:B). As a specific example, the conductive ARC 201B may be formed to a thickness of about 400 Angstroms by plasma enhanced chemical vapor deposition (PECVD) of silicon carbide (SiC) with the addition of phosphine gas ($PH_3$) or diborane gas ($B_2H_6$) during deposition.

Figure 5C:
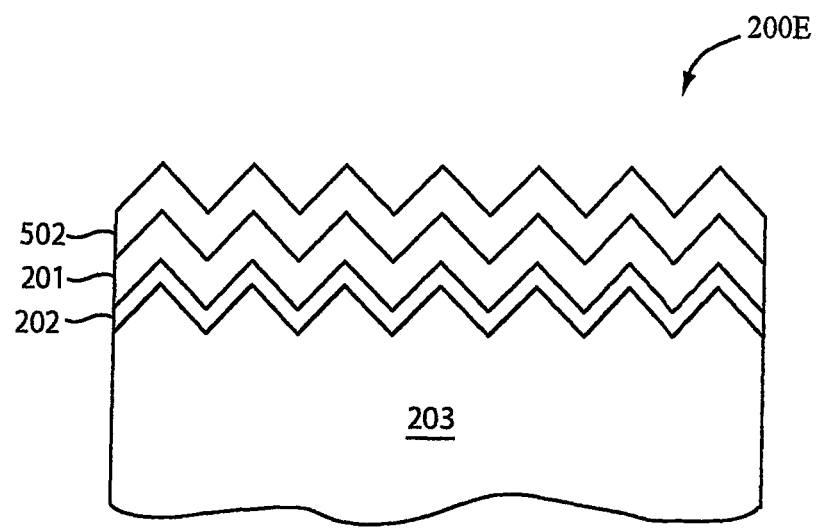

FIG. 5C schematically shows a cross section of a solar cell 200E in accordance with an embodiment of the present invention. The solar cell 200E is a specific embodiment of the solar cell 200 shown in FIG. 2. The solar cell 200E is the same as the solar cell 200 except that a transparent conductive layer 502 is formed on top of the anti-reflective coating 201. In the example of FIG. 5C, the passivation layer 202 comprises silicon dioxide, the anti-reflective coating 201 comprises silicon nitride, and the silicon wafer 203 comprises an N-type wafer. Like the conductive coating 501 of solar cell 200C (FIG. 5A), the transparent conductive layer 502 allows charge in the anti-reflective coating 201 to travel a distance sufficient to reach natural defects in the passivation layer 202 and bleed to the bulk of the wafer 203.

Transparent conductive layer 502 may be evaporated, sputtered, or deposited directly on top of the anti-reflective coating 201. The transparent conductive layer 502 may comprise a transparent conductive oxide, such as tin oxide doped with fluorine (SnO:F), zinc oxide doped with boron (ZnO:B), or silicon carbide doped with phosphorus (SiC:P) or boron (SiC:B) formed to a thickness of about 200 Angstroms.

Figure 5D:
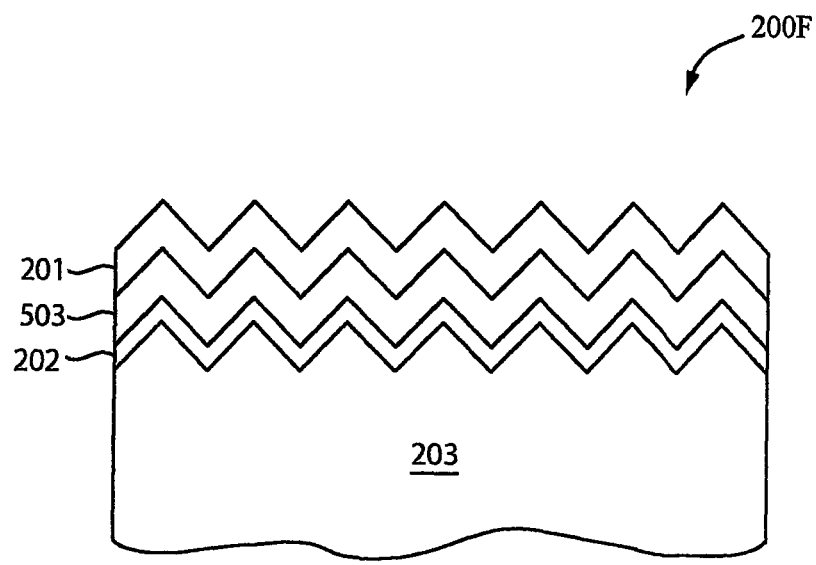

FIG. 5D schematically shows a cross section of a solar cell 200F in accordance with an embodiment of the present invention. The solar cell 200F is a specific embodiment of the solar cell 200 shown in FIG. 2. The solar cell 200F is the same as the solar cell 200 except that a relatively thin (e.g. about 200 Angstroms) conductive layer 503 is formed between the passivation layer 202 and the anti-reflective coating 201. In the example of FIG. 5D, the passivation layer 202 comprises silicon dioxide, the anti-reflective coating 201 comprises silicon nitride, and the silicon wafer 203 comprises an N-type wafer. The thin conductive layer 503 allows charge to bleed from the anti-reflective coating 201, to the thin conductive layer 503, and to the bulk of the wafer 203 through natural defects in the passivation layer 202. In one embodiment, the conductive layer 503 comprises polysilicon formed to a thickness of about 200 Angstroms directly on the top surface of the passivation layer 202. The anti-reflective coating 201 may be formed directly on a surface of the conductive layer 503. The conductive layer 503 may be formed by PECVD and in-situ (i.e. in the same chamber or cluster tool in one loading) with the formation of the anti-reflective coating 201. The conductive layer 503 may also comprise tin oxide doped with fluorine (SnO:F), zinc oxide doped with boron (ZnO:B), or silicon carbide doped with phosphorus (SiC:P) or boron (SiC:B) formed to a thickness of about 200 Angstroms.

In the embodiments of FIGS. 4 and 5, conductivity from the front side of the solar cell to the bulk of the wafer is increased to prevent harmful solar cell polarization. This is equivalent to lowering the shunt resistance $R_{sh}$ in the model of FIG. 3B. In other embodiments, the resistance from the front side of the solar cell to the rest of the module by way of the transparent cover is increased to prevent charge leakage. This is equivalent to increasing the resistance $R_{gl}$ in the model of FIG. 3B. Resistance from the front side of the solar cell to the rest of the solar cell module may be increased by blocking the charge leakage path, as now described with reference to FIG. 6.

Figure 6:
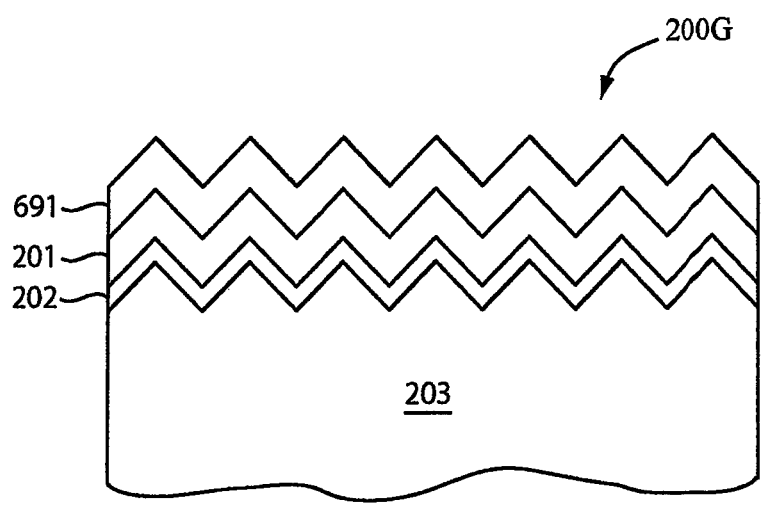

FIG. 6 schematically shows a cross section of a solar cell 200G in accordance with an embodiment of the present invention. The solar cell 200G is a specific embodiment of the solar cell 200 shown in FIG. 2. The solar cell 200G is the same as the solar cell 200 except that a transparent electrical insulator layer 691 is formed over the anti-reflective coating 201. In the example of FIG. 6, the passivation layer 202 comprises silicon dioxide, the anti-reflective coating 201 comprises silicon nitride, and the silicon wafer 203 comprises an N-type wafer. The electrical insulator layer 691 is formed over the anti-reflective coating 201 to prevent solar cell polarization by preventing charge from leaking out from the front side of the solar cell 200G towards the cover 104 (see FIG. 2). In one embodiment, the electrical insulator layer 691 comprises silicon dioxide ($SiO_2$) formed to a thickness of about 0.1 to 1.0 μm by atmospheric pressure chemical vapor deposition (APCVD).

Harmful solar cell polarization may also be prevented by biasing a region of a solar cell module on the front side of the solar cell, as now discussed with reference to FIG. 7A.

Figure 7A:
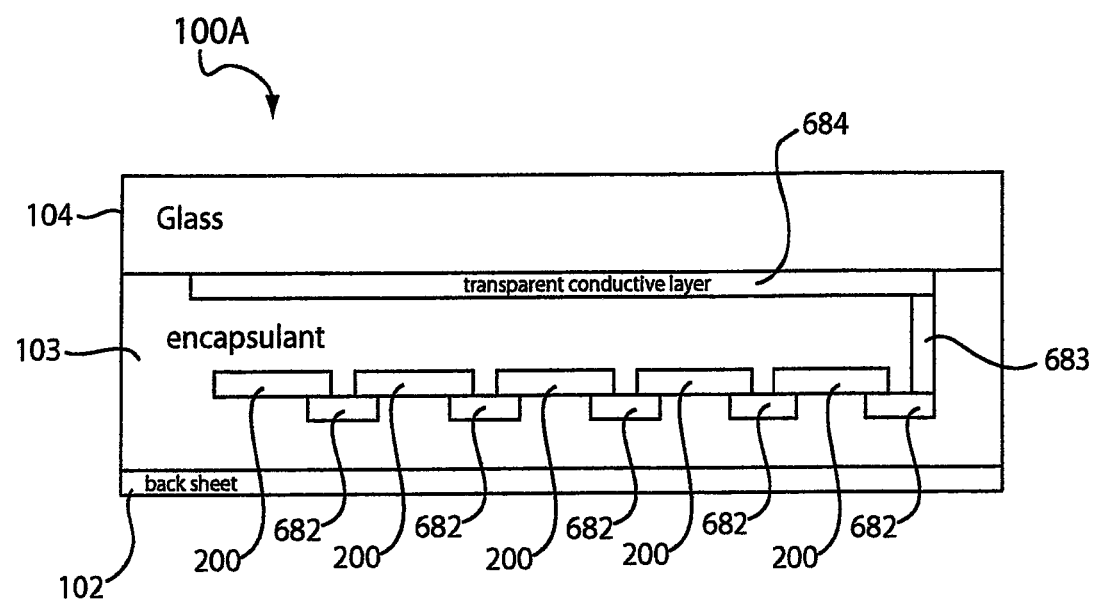
FIG. 7A schematically shows a solar cell module in accordance with an embodiment of the present invention.

FIG. 7A schematically shows a solar cell module 100A in accordance with an embodiment of the present invention. The solar cell module 100A is a specific embodiment of the solar cell module 100 shown in FIG. 2. Several solar cells 200, along with their interconnects 200, are shown in FIG. 7A. An interconnect 682 serially connects one solar cell 200 to another. The solar cell module 100A is essentially the same as the solar cell module 100 except that an electrically conductive path is added to bring up the potential of the part of the module in front of the cell to prevent harmful leakage current (i.e., above, at, or within 30V for n-type cell modules). In one embodiment, the conductive path is formed by placing a transparent electrically conductive layer 684 on the back surface of the transparent cover 104 (e.g. glass) and connecting the conductive layer 684 to the back surface of a solar cell 200. In the example of FIG. 7A, the conductive layer 684 is electrically connected to an interconnect 682, which is connected to the backside of a solar cell 200 by way of an electrical connection 683. In the example of FIG. 7A, the preferred embodiment is for the conductive layer 684 to be connected to the interconnect 682 that is connected to the highest (i.e. most positive) or near highest potential solar cell 200 in the array for cells with an n-type front side diffusion region, and the lowest (i.e., most negative) or near most negative potential solar cells 200 in the array for cells with a p-type front side diffusion region. The conductive layer 684 is isolated from the frame of the solar cell module 100A to prevent an unsafe condition where a high-voltage is on the exterior of the module. The conductive layer 684 may comprise tin oxide doped with fluorine (SnO:F), indium tin oxide (ITO), zinc oxide (ZnO), or other transparent oxides or transparent organic conductors. In the preferred embodiment, this conductive layer has a sheet resistance of approximately 5e4 ohm/square. The back sheet 102 is formed on the bottom surface of the encapsulant 103 as before. In an alternative embodiment, the encapsulant 103 is made electrically conductive to form a near-equipotential field above the solar cells 200; the encapsulant at the edges of the module remains electrically insulating to prevent an unsafe condition where a high-voltage is on the exterior of the module.

In a system level approach, the entire solar energy system is taken into consideration to prevent charge from leaking from the front side of the solar cell. For example, an array of solar cell modules may be biased such that leaking of charge carriers from the front side of the solar cells is prevented. Example system level approaches to the solar cell polarization problem are now described with reference to FIGS. 7B and 7C.

Figure 7B:
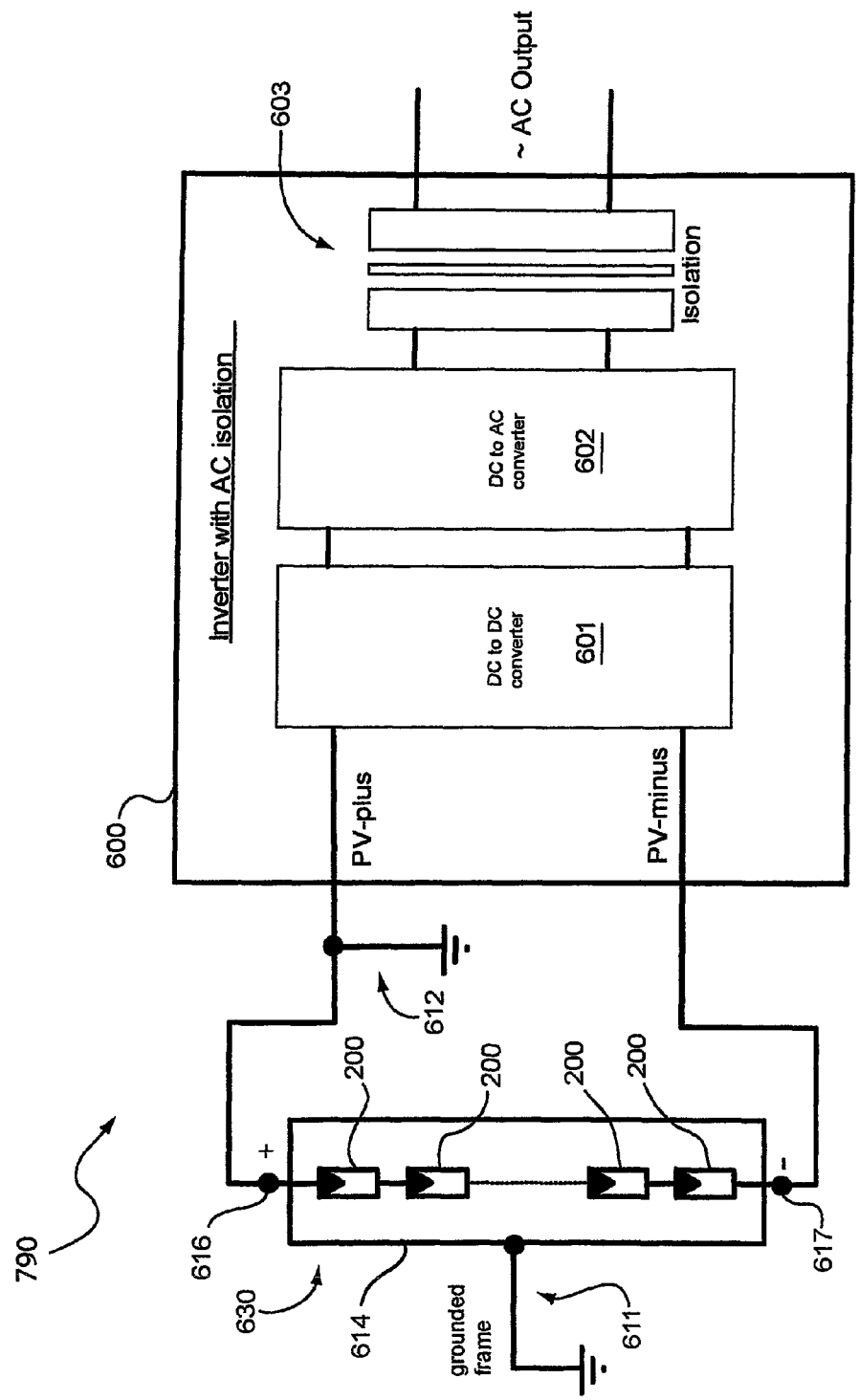
FIGS. 7B and 7C schematically show solar energy systems in accordance with embodiments of the present invention.

FIG. 7B schematically illustrates a solar energy system 790 in accordance with an embodiment of the present invention. In the example of FIG. 7B, a solar cell module array 630 has several solar cell modules comprising interconnected solar cells 200. The positive output terminal of the solar cell module array 630 is labeled as node 616, while its negative output terminal is labeled as node 617. In the example of FIG. 7B, the solar cells 200 are series connected such that their positive terminals are toward the node 616 and their negative terminals are toward the node 617. There may be other series connected solar cells 200 in parallel to the series shown in FIG. 7B.

In the example of FIG. 7B, the solar cell module array 630 is coupled to an inverter 600. An inverter converts direct current (DC) to alternating current (AC). In the solar energy system 790, the inverter 600 receives direct current from the solar cell module array 630 and outputs alternating current to a power grid. As shown in FIG. 7B, a DC to DC converter 601 converts direct current from the solar cell module array 630 to another direct current. The direct current output of the DC to DC converter 601 is converted to alternating current by DC to AC converter 602. The alternating current output of the DC to AC converter 602 is provided to the power grid by way of an isolation circuit 603. Alternatively, the isolation circuit 603 may be in series between the DC to DC converter 601 and the DC to AC converter 602.

In the solar energy system 790, the positive terminal of the solar cell array module 630 is grounded. Systems similar to the solar energy system 790 may be used in North America and Japan among other countries. The frame 614, which represents the frame of all solar cell modules in the solar cell module array 630 is also grounded as indicated by the label 611. Grounding the positive terminal of the solar cell module array 630 and the frame 614 reduces the potential between the solar cells 200 and the frame 614, minimizing leakage from the front side of the solar cells 200. The positive terminal of the solar cell module array 630 may be tied to ground within or outside of the inverter 600.

In the example of FIG. 7B, each solar cell 200 has an n-type front side diffusion region. In this case, harmful solar cell polarization occurs because the solar cells 200 become positively biased relative to ground. To prevent harmful polarization, the highest or near highest potential of the solar cell module array 630 (node 616 in this case) is accordingly tied to ground. In other embodiments where the solar cells have a p-type front side diffusion region, harmful polarization may occur when the solar cells become negatively biased relative to ground. In that case, the lowest or near lowest potential solar cell in the array (e.g. the negative output terminal of the solar cell module array) may be tied to ground to prevent harmful solar cell polarization.

Figure 7C:
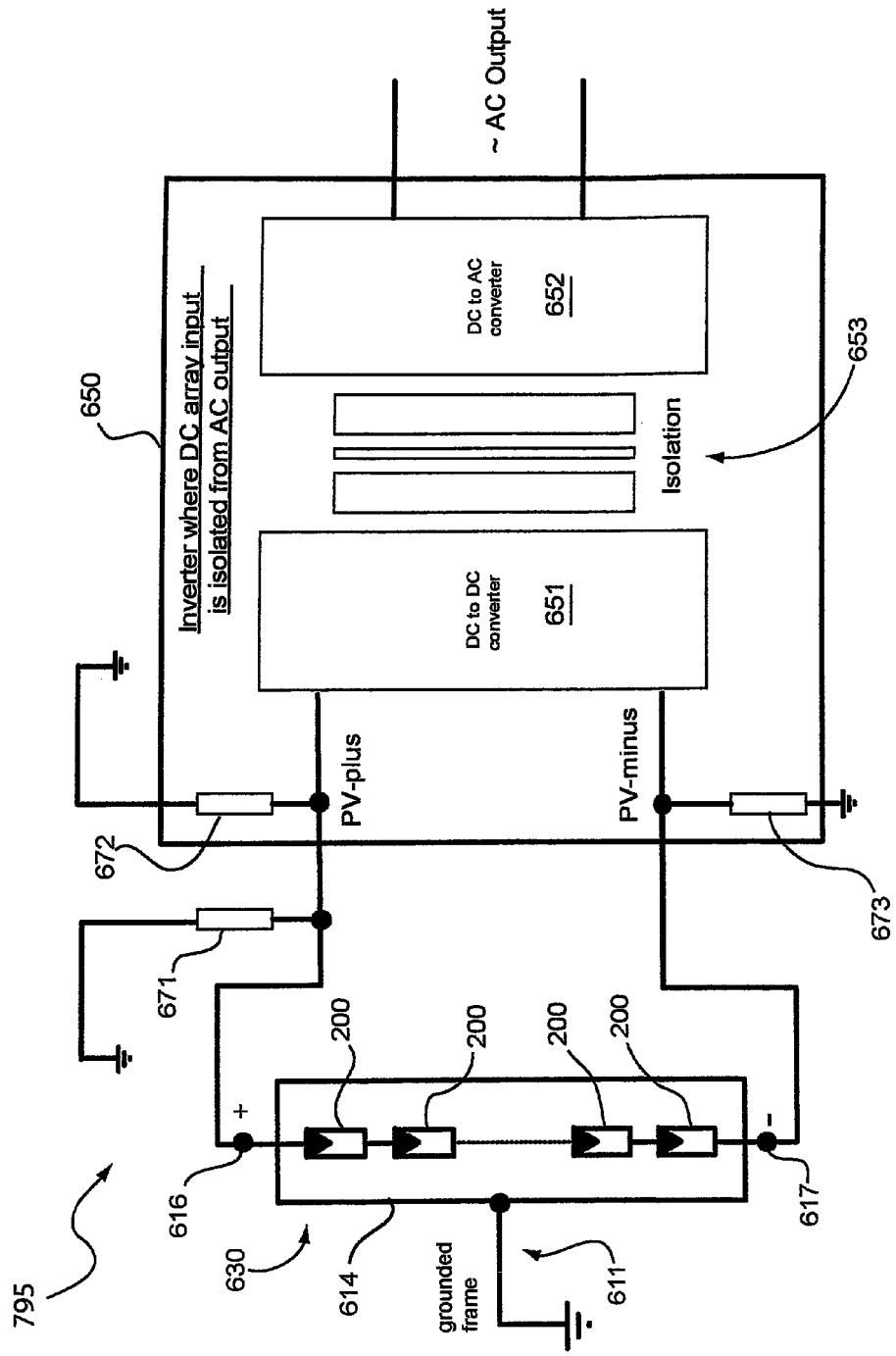

FIG. 7C schematically illustrates a solar energy system 795 in accordance with an embodiment of the present invention. In the example of FIG. 7C, the solar cell module array 630 has several solar cell modules comprising several inter-connected solar cells 200. The positive output terminal of the solar cell module array 630 is labeled as node 616, while its negative output terminal is labeled as node 617. In the example of FIG. 7C, the solar cells 200 are series connected such that their positive terminals are toward the node 616 and their negative terminals are toward the node 617. There may be other series connected solar cells 200 in parallel to the series shown in FIG. 7C.

In the example of FIG. 7C, the solar cell module array 630 is coupled to an inverter 650. The inverter 650 receives direct current from the solar cell module array 630 and outputs alternating current to the power grid. As shown in FIG. 7C, a DC to DC converter 651 converts direct current from the solar cell module array 630 to another direct current. The direct current output of the DC to DC converter 651 is coupled to a DC to AC converter 652 by an isolation circuit 653. The alternating current output of the DC to AC converter 652 is provided to the power grid. Alternatively, the isolation circuit 653 may be located at the output of the DC to AC converter 652 to provide AC output to the power grid. Systems similar to the solar energy system 795 may be employed in countries covered by IEC regulations, such as most European countries, the United Kingdom, and others.

In the example of FIG. 7C, the output of the solar cell array module 630 is balanced to +/−1/2 (i.e. plus/minus half) the value of the total voltage of the solar cell module array 630. That is, the voltage at node 616 is ideally +1/2 of the total voltage of the solar cell module array 630, while the voltage at node 617 is ideally −1/2 of the total voltage of the solar cell array module 630. The resistors 672 and 673 are high value resistors (or varistors) that balance the output of the solar cell module array 630 at around the ground point. In practice, the output of the solar cell module array 630 is only approximately balanced because the balancing resistors 672 and 673 have high resistance (e.g. about 10MΩ each).

In a typical installation, the solar cell module array 630 would be floating because there would be no resistor 671 and the inverter 650 has DC-DC isolation between the output of the solar cell module array 630 and the AC output to the power grid. The inventors discovered, however, that such an installation will cause harmful polarization of solar cells 200. In one embodiment, the positive terminal of the solar cell module array 630 is connected to ground by way of a resistor 671. The resistor 671 may be a fixed, variable, or electronically controlled resistance without detracting from the merits of the present invention. The resistor 671 biases the solar cell module array 630 closer to the positive side of its output to prevent positive charge from leaking from the front sides of the solar cells 200. In other words, the resistor 671 "unbalances" the output of the solar cell module array 630 towards positive to prevent solar cell polarization.

Similarly, if the solar cell polarization is caused by electrons (rather than positive charges) leaking from the front side of solar cells 200, node 617 (instead of node 616) may be connected to ground by way of the resistor 671 to bias the solar cell module array 630 towards its negative output. The resistor 671 may have a resistance of about ≤1/10$^{th}$ of the value of a balancing resistor (i.e. resistor 672 or 673). It is to be noted that inverter 650 may also be configured such that it unbalances the balanced output of the solar cell module array 630 towards positive or negative, depending on the polarity of the leaking charge carrier (i.e. electrons or holes). For example, the value of resistor 672 may be increased relative to resistor 673 to unbalance the output of the solar cell module array 630 without using the resistor 671.

The resistor 671 may also comprise an electronically controlled resistance. For example, the resistance of the resistor 671 may be controlled by an electronic circuit by switching in different resistance values depending on condition. Such an electronic circuit may have sensors that detect when a lower resistance is needed when the solar cell module array resistance is reduced to ground level, such as when raining, for example.

In the example of FIG. 7C, each solar cell 200 has an n-type front side diffusion region. In this case, harmful solar cell polarization occurs because the solar cells 200 become positively biased relative to ground. To prevent harmful polarization, the highest or near highest potential of the solar cell module array 630 (node 616 in this case) is accordingly tied to ground by way of a resistance (e.g. resistor 671). In other embodiments where the solar cells have a p-type front side diffusion region, harmful polarization may occur when the solar cells become negatively biased relative to ground. In that case, the lowest or near lowest potential solar cell in the array (e.g. the negative output terminal of the solar cell module array) may be tied to ground by way of a resistance to prevent harmful solar cell polarization.

Techniques for preventing harmful solar cell polarization have been disclosed. While specific embodiments of the present invention have been provided, it is to be understood that these embodiments are for illustration purposes and not limiting. Many additional embodiments will be apparent to persons of ordinary skill in the art reading this disclosure.

What is claimed is:

1. A method of preventing harmful polarization of solar cells, the method comprising:
   connecting a plurality of solar cells in series, the series having a positive terminal at one end and a negative terminal at an opposing end, the positive terminal being at positive potential relative to the negative terminal, each solar cell in the plurality of solar cells having an N-type front side diffusion region and a dielectric over the N-type front side diffusion region;
   grounding a frame of the plurality of solar cells;
   grounding the positive terminal;
   coupling the plurality of solar cells to an inverter configured to convert direct current generated by the plurality of solar cells to alternating current to be provided to a power grid, wherein the plurality of solar cells comprises backside contact solar cells; and
   unbalancing a balanced output provided by the plurality of solar cells to the inverter.

2. The method of claim 1, further comprising:
   isolating the inverter from the power grid.

3. The method of claim 1, further comprising:
   coupling the plurality of solar cells to an input of a DC to DC converter of the inverter;
   converting a direct current output of the DC to DC converter to an alternating current output using a DC to AC converter of the inverter; and
   providing the alternating current output of the DC to AC inverter to the power grid.

4. The method of claim 3, further comprising:
   isolating the DC to DC converter from the DC to AC converter.

5. The method of claim 1, wherein the positive terminal of the series is grounded within the inverter.

6. The method of claim 1, wherein the positive terminal of the series is grounded outside the inverter.

7. A method of preventing harmful polarization of solar cells, the method comprising:
   providing a solar cell module array comprising a plurality of solar cells, the solar cells being coupled in series such that a first node of the series is at a positive potential and a second opposing node of the series is at a negative potential relative to the first node, each solar cell in the plurality of solar cells having a doped front side diffusion region and a dielectric over the doped front side diffusion region;
   coupling an inverter to the solar cell module array, the inverter being configured to convert direct current generated by the solar cell module array to alternating current to be provided to a power grid;
   grounding the first node of the series and a frame of a solar cell module in the solar cell module array to reduce positive potential between the solar cells and the frame, wherein the inverter is configured to receive a balanced voltage from the solar cell module array; and
   coupling a first resistor to the first node of the series to ground, the first resistor having a value configured to unbalance the balanced voltage from the solar cell module array.

8. The method of claim 7, further comprising:
coupling the first node to ground by way of a second resistor; and
coupling the second node to ground by way of a third resistor.

9. The method of claim 7, further comprising:
isolating the inverter from the power grid.

10. The method of claim 7, wherein coupling the inverter to the solar cell module array comprises:
coupling the solar cell module array to a DC to DC converter of the inverter;
converting a direct current output of the DC to DC converter to the alternating current output using a DC to AC converter of the inverter; and
providing the alternating current output of the DC to AC converter to the power grid.

11. The method of claim 10, further comprising:
isolating the DC to DC converter from the DC to AC converter.

12. The method of claim 7, wherein the plurality of solar cells comprises backside contact solar cells.

13. A method of preventing harmful polarization of solar cells, the method comprising:
providing a series of solar cells in a solar cell module array, the series of solar cells having a first node and a second node opposite the first node, the first node being at a positive potential and the second node being at a negative potential relative to the first node, each solar cell in the series of solar cells having a front side facing the sun during normal operation and a backside opposite the front side;
tying a frame of a solar cell module in the solar cell module array to ground;
coupling the series of solar cells to an inverter, the inverter being configured to convert direct current generated by the series of solar cells to alternating current to be provided to a power grid;
tying either the first node or the second node to ground, the first node being tied to ground when solar cells in the series of solar cells have an N-type front side diffusion regions, the second node being tied to ground when solar cells in the series of solar cells have a P-type front side diffusion regions.

14. The method of claim 13, wherein the first node is tied to ground by way of a resistor.

15. The method of claim 13, wherein the inverter is configured to receive a balanced voltage from the series of solar cells and further comprising:
coupling the first node to ground by way of a resistor, the resistor having a value configured to unbalance the balanced voltage from the series of solar cells.

16. The method of claim 13, wherein the inverter is configured to receive a balanced voltage from the solar cell module array and further comprising:
coupling the second node to ground by way of a resistor, the resistor having a value configured to unbalance the balanced voltage from the series of solar cells.

17. The method of claim 13, further comprising: isolating the inverter from the power grid.

* * * * *